(12) United States Patent
Rispoli et al.

(10) Patent No.: US 10,614,934 B2
(45) Date of Patent: Apr. 7, 2020

(54) FLEXIBLE CONDUCTIVE ELEMENT AND SHAPING METHOD THEREOF

(71) Applicant: I.R.C.A. S.P.A. Industria Resistenze Corazzate E Affini, San Vendemiano (IT)

(72) Inventors: Omar Rispoli, Colle Umberto (IT); Federico Zoppas, Treviso (IT)

(73) Assignee: I.R.C.A. S.P.A. Industria Resistenze Corazzate E Affini, San Vendemiano (IT)

( * ) Notice: Subject to any disclaimer, the term of this patent is extended or adjusted under 35 U.S.C. 154(b) by 0 days.

(21) Appl. No.: 16/462,463

(22) PCT Filed: Nov. 28, 2017

(86) PCT No.: PCT/IB2017/057444
§ 371 (c)(1),
(2) Date: May 20, 2019

(87) PCT Pub. No.: WO2018/096520
PCT Pub. Date: May 31, 2018

(65) Prior Publication Data
US 2019/0378637 A1    Dec. 12, 2019

(30) Foreign Application Priority Data
Nov. 28, 2016  (IT) .................. 102016000120278

(51) Int. Cl.
*H01C 3/06*     (2006.01)
*H05K 1/09*     (2006.01)
(Continued)

(52) U.S. Cl.
CPC .............. *H01C 3/06* (2013.01); *B62D 1/06* (2013.01); *H05K 1/0277* (2013.01); *H05K 1/0353* (2013.01); *H05K 1/092* (2013.01); *B29C 55/24* (2013.01); *B29K 2101/12* (2013.01); *B29L 2031/3425* (2013.01); *H05K 2201/0145* (2013.01); *H05K 2201/0158* (2013.01)

(58) Field of Classification Search
CPC ... H01C 1/03; H01C 3/12; H05B 3/36; H05K 1/167; H05K 1/092
See application file for complete search history.

(56) References Cited

U.S. PATENT DOCUMENTS 3,764,422 A   10/1973  Koritke et al.
5,111,178 A *  5/1992  Bosze ................ H01B 1/22
                                          338/160

(Continued)

FOREIGN PATENT DOCUMENTS

EP          0874374        10/1998

*Primary Examiner* — Kyung S Lee
(74) *Attorney, Agent, or Firm* — Stetina Brunda Garred & Brucker (57) ABSTRACT

A method to plastically deform a flexible conductive element (1) wherein is provided a device (11) configured to expand the volume thereof, wherein the method comprises the steps of arranging the flexible conductive element (1) at least partially around said device (11); expanding the volume of the device (11) up to a predetermined value, whereby at least one portion (8) of the flexible conductive element (1) which is in contact with the device (11) during the expansion of the device (11) is plastically deformed.

22 Claims, 4 Drawing Sheets

(51) Int. Cl.
*H05K 1/02* (2006.01)
*H05K 1/03* (2006.01)
*B62D 1/06* (2006.01)
B29L 31/34 (2006.01)
B29C 55/24 (2006.01)
B29K 101/12 (2006.01)

(56) References Cited

U.S. PATENT DOCUMENTS

| | | |
|---|---|---|
| 5,385,785 A | 1/1995 | Lovell |
| 5,814,262 A * | 9/1998 | Ketcham ............ C04B 35/62218 264/316 |
| 6,497,945 B1 * | 12/2002 | Niedner .................... B28B 1/50 428/304.4 |
| 6,891,465 B2 * | 5/2005 | Hatayama ............. H01C 10/305 338/118 |
| 7,155,812 B1 | 1/2007 | Peterson et al. |
| 2012/0279762 A1 | 11/2012 | Hur et al. |
| 2015/0129276 A1 | 5/2015 | Shumaker et al. |

\* cited by examiner

FLEXIBLE CONDUCTIVE ELEMENT AND SHAPING METHOD THEREOF

CROSS REFERENCE TO RELATED APPLICATION(S)

The present application claims priority to PCT International Application No. PCT/IB2017/057444 filed on Nov. 28, 2017, which application claims priority to Italian Patent Application Nos. 102016000120278 filed Nov. 28, 2016, the entirety of the disclosures of which are expressly incorporated herein by reference.

STATEMENT RE: FEDERALLY SPONSORED RESEARCH/DEVELOPMENT

Not Applicable.

FIELD OF THE INVENTION

The present invention relates to a flexible conductive element and to a shaping method thereof.

BACKGROUND ART

Flexible flat resistors are increasingly used in different fields of application. Typically, these resistors, which are flexible conductive elements, are used as heating means or as sensors.

Generally, flexible flat resistors comprise two layers of insulating material in which a metal track is incorporated. The resistive metal track or foil is typically connected to an electrical power source. The overall thickness of flexible flat resistors is very limited, generally of between a few tens and a few hundreds of microns. For this reason these resistors are called "flat", having one dimension much smaller with respect to the other two. Furthermore, in resting conditions, in particular when they are not subject to external forces, these resistors have a substantially flat shape.

In some applications, it would be interesting to coat an item with a flexible flat resistor. However, especially when the item to be coated has a relatively complex geometry, the coating of such an item with a flexible flat resistor has disadvantages. For example, an item with relatively small radii of curvature cannot be optimally coated with a flexible flat resistor. In particular, when the resistor wraps the item, numerous creases or ripples are formed. Furthermore, during the coating operation the metal track is subject to breakage. Furthermore, it would be advantageous to have flexible flat resistors which are more performing with respect to the state of the art.

Therefore, the need to overcome such drawbacks is felt.

SUMMARY OF THE INVENTION

It is an object of the present invention to provide a method to deform a flexible conductive element, such as, for example, a flexible resistor, so as to coat an item, even with a complex shape, minimizing or eliminating the formation of creases or ripples of the flexible conductive element.

It is another object of the present invention to provide a method to deform a flexible conductive element, such as, for example, a flexible resistor, which does not cause the breakage of the metal track.

It is another object of the present invention to provide a method to deform a flexible resistor which suits the logic of mass-production.

It is a further object of the present invention to provide a flexible conductive element, such as, for example, a flexible resistor, which is better with respect to the state of the art.

The present invention achieves these and other objects which will be apparent in light of the present description, providing a shaping method to plastically deform a flexible conductive element comprising at least one insulating layer and at least one conductive track fixed to the at least one insulating layer, wherein there is provided a device having an outer surface destined to come in contact with the flexible conductive element, and configured to expand the volume thereof, preferably at least radially outwardly, wherein the method comprises the steps of a) arranging the flexible conductive element at least partially around said device, b) expanding the volume of the device up to a predetermined value, whereby at least one portion of the flexible conductive element which is in contact with the device during the expansion of the device is plastically deformed, c) separating the flexible conductive element from the device.

According to one aspect, the invention also provides a flexible conductive element adapted to be plastically deformed by the method of the invention, comprising at least one insulating layer and at least one conductive track fixed to the at least one insulating layer, wherein the conductive track has a plurality of stretches, and wherein the adjacent stretches of said plurality of stretches have a different orientation one with respect to another.

According to another aspect, the invention also provides a steering wheel coated with such flexible conductive element, for example, with a flexible resistor, acting as a heating element and/or as a sensor.

Advantageously, by virtue of the invention it is possible to optimally coat an item with a flexible conductive element. A flexible resistor is in fact provided, suitably deformed, so that when the flexible resistor wraps the item, the coating obtained is optimal, minimizing or eliminating the formation of ripples on the flexible resistor. With the method of the invention it is possible to give to the flexible resistor a shape such as to make it particularly adapted to coat items of a complex shape. For example, by deforming the flexible resistor, so as to have an at least partially toroidal shape, it is possible to optimally coat the steering wheel of a vehicle, for example the steering wheel of a car.

Furthermore, the method of the invention is perfectly compatible with the logic of mass-production. In fact, it provides optimal results, in particular in terms of reproducibility, reliability, speed of execution and automation. The flexible flat resistor is in fact stretched in a controlled manner along the longitudinal development, preferably entirely along such development, of the flexible resistor, ensuring a homogeneous and/or localized deformation in one or more specific areas.

Another advantageous aspect is given by the fact that a flexible resistor of a complex shape is obtained without the metal track, or the metal tracks if a greater number is provided, breaking during deformation.

Internally, tests have been carried out in which a flexible flat resistor was attempted to be deformed in different ways with respect to that provided by the present invention. However, the results of such tests were not satisfactory. In fact, the stretching of the flexible resistor was neither homogeneous nor fast, and introduced a considerable defectiveness both due to the involuntary breakage of the resistive tracks and due to the presence of ripples, especially when the resistor was applied to a steering wheel.

The invention also provides a flexible resistor which, not only is improved with respect to the state of the art, but is also particularly adapted to be deformed by the method of the invention. In fact, to this end, it is preferred to select designs, or shapes, of the resistive track which allow deformations of the flexible resistor in the three dimensions without interruptions or mechanical breakages, not even partial, occurring on the metal tracks. To this end, it is preferred that the overall percentage of resistive track stretches parallel to the main deformation axis of the flexible resistor is lower than 50% with respect to the total number of metal track stretches.

Alternatively, it is preferred that the sum of the components parallel to the main deformation axis of the stretches 3 of the track is lower than 50% with respect to the sum of the components perpendicular to the main deformation axis of such stretches.

Additionally, or alternatively to such feature, it is preferred that adjacent resistive track stretches having different orientation are joined to one another with radii of curvature greater than 0.5 mm, preferably greater than 1 mm, even more preferably greater than 2 mm.

Typically, the invention provides that the metal track, or metal tracks, have a relatively complex shape. For example, each metal track can have a substantially serpentine shape.

It is further preferable that each metal track is provided with a plurality of side branches or extensions, preferably radial branches, which typically are not crossed by electric current, and which serve to transmit the heat generated by the metal track to areas of the insulating layer without the metal track.

In other words, the function of such branches is to act as dissipating fins, which contribute to better uniform and disperse the thermal flow generated by the electric current running through the resistive tracks on the surface of the flexible resistor. Preferably, the branches are made of the same material which the respective resistive track is made of, the branches being preferably integral with the respective resistive track.

The dependent claims describe preferred embodiments of the invention.

BRIEF DESCRIPTION OF THE FIGURES

Further features and advantages of the invention will become more apparent in light of the detailed description of preferred, but not exclusive, embodiments of a shaping method of a flexible conductive element. It is also described an embodiment of a device with which it is possible to implement the method of the invention, as well as at least one embodiment of a flexible conductive element particularly adapted to be deformed by such method. The description is provided by way of explanation and not by way of limitation, with reference to the attached drawings, also provided by way of explanation and not by way of limitation, in which.

The same references in the Figures identify the same or analogous elements or components.

DETAILED DESCRIPTION OF ONE PREFERRED EMBODIMENT OF THE INVENTION

With reference to the Figures, a shaping method to plastically deform a substantially flat flexible conductive element 1 is shown. The flexible conductive element 1 may also be called flexible resistive element or flexible resistor or flexible flat resistor.

Briefly, a device 11 is provided having an outer surface 12 destined to come in contact with the flexible conductive element 1. The flexible conductive element 1 comprises at least one insulating layer 2 and at least one conductive track 4 fixed to the insulating layer 2. The device 11 is configured to expand the volume thereof, at least radially outwardly.

The Method Comprises the Steps of:

a) arranging the flexible conductive element 1 at least partially around said device 11, in particular at least partially around and in contact with the outer surface 12;

b) expanding the volume of the device 11 up to a predetermined value, whereby at least one portion 8 of the flexible conductive element 1 which is in contact with the device 11 during the expansion of the device 11 is plastically deformed;

c) separating the deformed flexible conductive element 1 from the device 11.

By way of example, the flexible conductive element 1 is a flexible flat resistor 1.

Preferably, the at least one insulating layer 2 has a thickness of between 90 and 500 μm.

The overall thickness of the flexible flat resistor 1 is preferably of between 0.1 and 1.4 mm, or of between 0.1 and 1.2 mm, or of between 0.1 and 0.8 mm, or of between 0.2 and 0.8 mm, or of between 0.1 and 0.4 mm, or of between 0.2 and 0.4 mm Typically, the thickness is much lower than the length and the width of the flexible flat resistor 1. For example, the length may be of between 900 and 1200 mm, and the width may be of between 80 and 160 mm, or of between 80 and 100 mm. The flexible flat resistor 1 comprises at least one layer of insulating material 2 provided, for example above the insulating layer 2, with at least one metal track or foil 4, also said resistive track or foil, or conductive track. Preferably, the flexible flat resistor 1 comprises only one layer of insulating material 2 which the metal track 4 is coupled to. Alternatively, the flexible flat resistor 1 may be multilayer, in the sense that it comprises two or more layers of insulating material between which the metal track is incorporated. In general, the flexible flat resistor may be single, or may be formed by the overlapping of two or more insulating layers, each provided with at least one respective metal track. For example, a single flexible flat resistor is formed by an insulating layer on which the at least one resistive track is fastened. According to an example of multilayer flexible flat resistor, a first insulating layer is provided, on which the at least one first metal track is arranged; on the at least one first metal track and on the first insulating layer a second insulating layer is provided, on which at least one second metal track is provided; the at least one second metal track may be on the face of the second insulating layer, which is proximal to or distal from the at least one first metal track. Exclusively by way of explanation, the first metal track may be used as heating means, and the second metal track may be used as capacitive or resistive sensor means.

Typically, each metal track has a lower superficial extension than the respective insulating layer or insulating layers which it is coupled to.

Preferably, the at least one metal track 4 has a width of between 1 and 8 mm.

The support insulating material, i.e. the material of the insulating layer 2, is typically a polymeric material. Exclusively by way of example and not by way of limitation, insulating materials are PVC, PTFE, PS, PP, PE, PC, ABS, PET, PA, PU (also expanded), PUR, NBR, Silicone, EPDM and the like, optionally with additives. In general, thermoplastic and elastomeric materials may be used, which have suitable elongation capabilities. Preferably, at least one insulating layer 2 is provided made of a polymeric non-elastomeric material, preferably a non-elastomeric and non-silicone material. Preferably, at least one insulating layer 2 is provided, made of Polyvinyl chloride or Polystyrene or Polypropylene or Polyethylene or Polyethylene terephthalate or Polyurethane.

The at least one metal track 4, which may have a complex geometry, is adapted to be connected to an electrical power source, typically by means of one or more connectors 7a, 7b. Exclusively by way of example and not by way of limitation, materials with which the metal track may be made of are Aluminum, Constantan, Copper, German Silver, Steel, Inconel, Brass and the like. Preferably, the metal track 4 is made of aluminum. Preferably, the metal track 4 has a thickness of between 10 and 200 μm.

The flat resistor is flexible 1, in the sense that the flat resistor 1 may be elastically deformed when external forces are applied thereon.

Furthermore, when subjected to a suitable force, the flexible flat resistor 1 may be deformed by plastic deformation, being subjected for example to a stretching.

The method of the invention provides the use of the device 11, also said shaping device, having an outer surface 12 destined to come in contact with the flexible conductive element 1, or flexible resistor, to obtain the aforesaid plastic deformation thereof. Such device 11 is configured to expand the volume thereof, in particular radially outwardly.

Exclusively by way of explanation, a device 11 adapted to the shaping method comprises a chamber 14 for a fluid. The chamber 14 is expandable, in particular radially outwardly. The aforesaid outer surface 12 of the chamber 14, at least when the chamber is expanded, has a predetermined shape, which is substantially equal to the shape which is intended to be given to the flexible resistor 1.

Preferably, the shape of such surface 12 is toroidal, or at least partially toroidal, it being understood that also shapes different from this one may be provided. In particular, in the case of a toroidal surface, the outer surface 12 of the expanded chamber 14 is curved, more precisely, it is shaped as the outer surface of a toroid. Preferably, the radius of curvature is of between 10 and 20 mm, more preferably of between 12.5 and 17.5 mm. It is also optionally provided that the shape of the toroid is elliptic.

Furthermore, it is preferable that the chamber 14 is made of a material adapted to elastically deform, for example of an elastomeric material. To expand the chamber 14, a fluid is entered inside the chamber 14, for example a gas, such as air, or a liquid. To this end, the chamber is provided with a specific fluid entrance, for example a valve. When the fluid is expelled from the chamber 14 of the device 11, the chamber 14 reduces the volume thereof, and therefore the volume of the device 11 is reduced.

Figure 5:
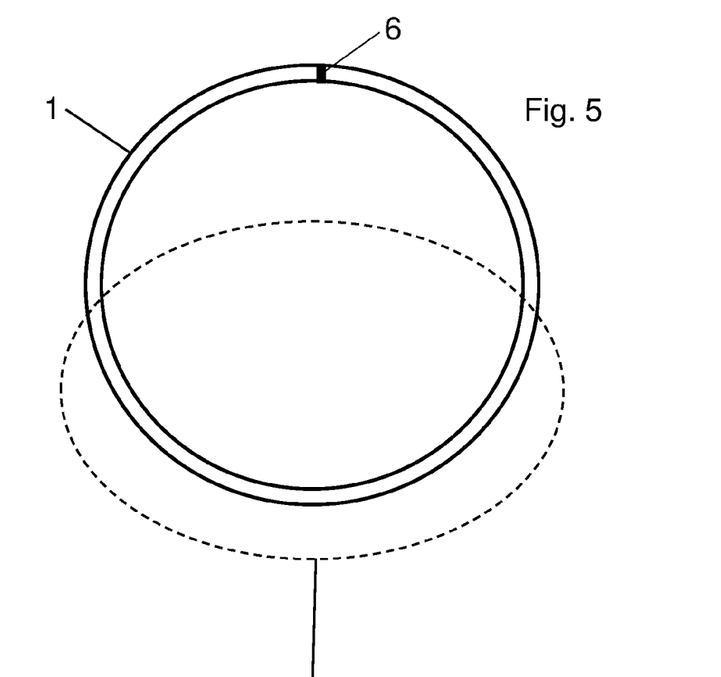
FIG. 5 schematically shows an element deformed in accordance with the invention.
Figure 6:
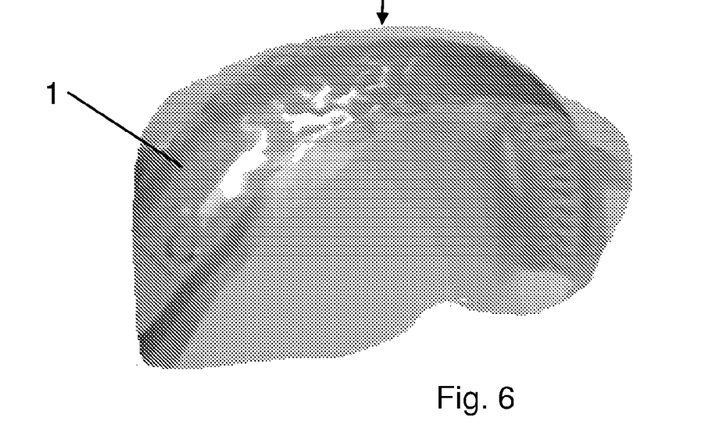
FIG. 6 shows an image of part of the element of FIG. 5.

The method comprises a step in which the flexible resistor 1 is arranged at least partially around the shaping device. The arrangement may be such that the two ends of the flexible resistor are not in contact with one another (substantially forming an open ring) or such that the two ends of the resistor are in contact with one another (substantially forming a closed ring). In the latter case, such ends may be fastened to one another. For example, the flexible resistor is wrapped around the shaping device and then the two edges of opposite ends are overlapped and secured with one another, for example by means of adhesive means, or by means of heat sealing, or by means of clamping means such as pliers, whereby a junction area 6 is defined (FIG. 5).

Furthermore, the arrangement is preferably such that the inner surface, proximal to the device 11, of the flexible resistor 1 is in contact with the outer surface 12 of the device 11. Alternatively, the inner surface of the flexible resistor 1 may initially be separated from the outer surface 12 of the device 11, and the flexible resistor 1 gets in contact with the device 11 when the latter reaches a predetermined expansion degree.

Figure 1:
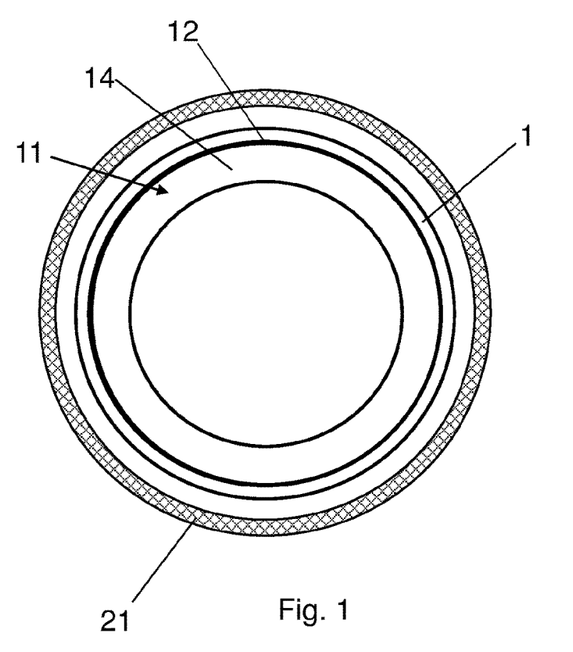
FIG. 1 schematically shows a step of the method of the invention.
Figure 2:
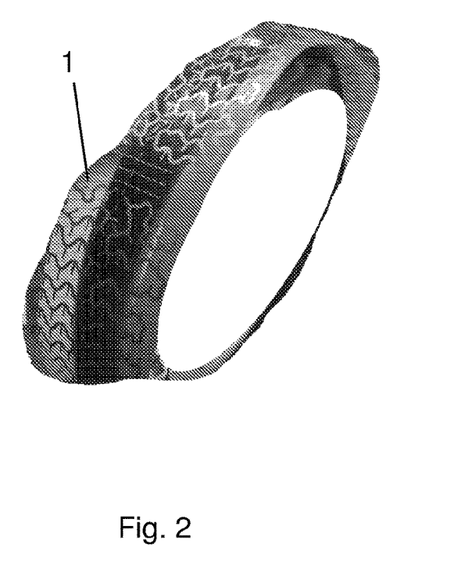
FIG. 2 shows an image of part of the flexible conductive element in the step of FIG. 1.
Figure 3:
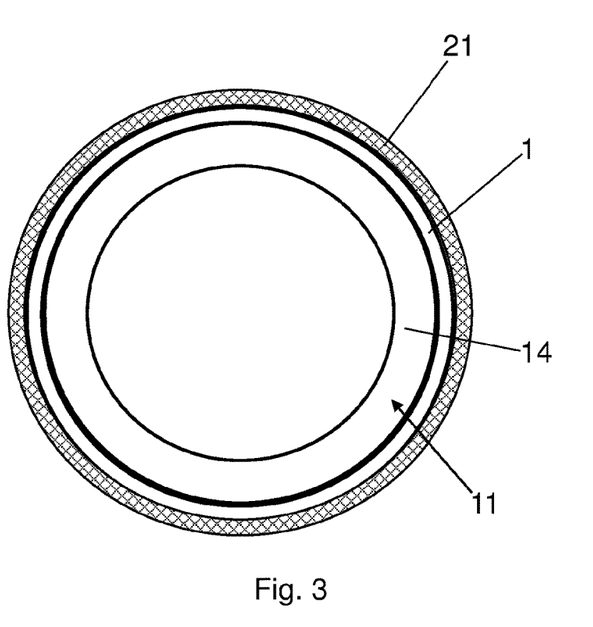
FIG. 3 schematically shows another step of the method of the invention.
Figure 4:
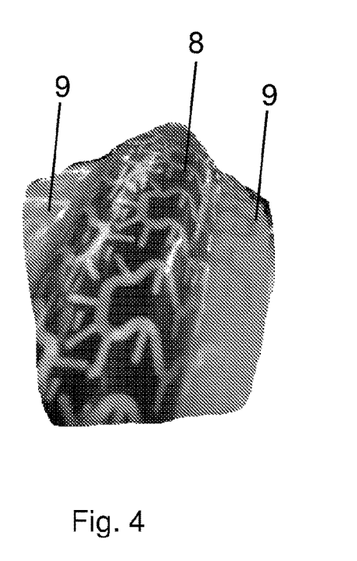
FIG. 4 shows an image of part of the flexible conductive element in the step of FIG. 3.

Preferably, but not exclusively, the size of the shaping device 11 is such that only a portion 8 (FIG. 4) of the width of the flexible resistor 1 is deformed. For example, with such dimensioning, only a central portion 8 of the flexible resistor 1 is deformed, while two side portions 9 remain substantially unchanged. Or a differentiated elongation may be obtained between the central area and the side areas. The width of the resistor typically indicates the dimension which is lower with respect to the length.

Subsequently, the volume of the device, in particular of the expandable chamber, is expanded in a controlled manner. The expansion of the device 11 is preferably carried out until reaching a predetermined deformation value, whereby the flexible resistor 1 is deformed according to the design. During the expansion of the device 11, the portion 8 of flexible resistor 1 which is in contact with the device 11 is deformed, in particular stretched, plastically.

Optionally, it is preferable to provide deformation control means to prevent the expansion of the volume of the device beyond the predetermined value.

According to an embodiment, the deformation control means comprise an abutment body 21, preferably of a substantially circular shape, arranged around the flexible conductive element 1. In particular, it is provided that the flexible conductive element 1 is between the device 11 and the abutment body 21. During the expansion of the device 11, when the flexible conductive element 1 abuts against the abutment body 21, the expansion of the device 11 is interrupted. The interruption may be manual or automatic. The shaping device 11 may have a frame on which the abutment body 21 is fastened.

Another example of deformation control means is provided by a laser pointer with a suitably directed laser beam. Suitable reference marks, to be used in combination with the laser pointer, may be applied on the flexible resistor.

Preferably, the invention also provides alignment means to suitably position and/or center the flexible resistor with respect to the device. Such alignment means may be of the mechanical type, for example, one or more plates may be provided. Alternatively, a laser pointer with a suitably directed laser beam may be provided, preferably matching the medial axis of the device, which acts as an optical guide for the correct positioning and centering of the flexible resistor. Also in this case, suitable reference marks, to be used in combination with the laser pointer, may be applied on the flexible resistor.

Other examples of deformation control means and/or alignment means for positioning and centering the flexible resistor may be optical, magnetic and/or electric and/or capacitive.

Preferably, during the expansion of the device or immediately before or afterwards, heat is administered to the flexible conductive element 1 so as to improve the deformation thereof and the keeping of the deformation itself. For example, the deformation may be improved when the flexible conductive element 1 is heated at a temperature greater than 20 or 25° C., for example of between 60 and 130° C.

The heat may be administered by means of thermoregulation means. For example, the heat may be administered by means of ovens, means producing a flow of hot air, or by means of the direct contact with hot surfaces heated for example by means of resistive means, or combinations thereof.

Alternatively, or additionally, the fluid may be entered into the expandable chamber 14 of the device 11 at a temperature greater than 20 or 25° C., for example of between 60 and 130° C.

In general, adjustment means may be provided which may increase or decrease the temperature, for example, with respect to 25° C.

In some cases, it may be advantageous that, once the device 11 has reached the volume predetermined to obtain the desired deformation, the deformed conductive element 1 is kept in contact with the expanded device 11 for a predetermined keeping time. In this way, the final shape of the conductive element 1 is stabilized.

Furthermore, after the deformation, cooling the deformed conductive element 1 may be advantageous. To this end, natural or forced air convection cooling means or cold stores may be provided. The cooling temperature is preferably such to bring the conductive element back to ambient temperature in a time preferably lower than 5 minutes.

Exclusively by way of example and not by way of limitation, the following table includes possible combinations of process parameters, valid, for example, when the insulating material is PVC or a similar material.

| Example | Heating Duration [minutes] | Heating Temperature [° C.] | Cooling Duration [minutes] | Cooling Temperature [° C.] |
| --- | --- | --- | --- | --- |
| 1 | 2 | +60 | 1 | −30 |
| 2 | 1 | +60 | 2 | +25 (ambient) |
| 3 | 2 | +90 | 1 | −30 |
| 4 | 1 | +90 | 2 | +25 (ambient) |
| 5 | 2 | +120 | 1 | −30 |
| 6 | 1 | +120 | 2 | +25 (ambient) |

Once deformed, the flexible conductive element 1 is separated from the device 11. To facilitate the detachment, the chamber 14 of the device 11 is preferably emptied, at least partially, of the fluid contained therein.

Figures from 9 to 12 show and example of a device 11 in accordance with the invention.

The device 11 is shown in the expanded configuration thereof. The flexible resistor 1 is arranged around the device. A countermold 31 is provided, acting as an abutment body to control the deformation of the resistor 1. The countermold 31 may be formed by two parts so as to be openable. Although in the described embodiment a countermold 31 is provided, arranged only on one side of the center plane of the device 11, a further complementary countermold may be provided, arranged on the other side of the center plane. The device 11 and the countermold 31 are connected to respective thermoregulation means 33, 35 which allow to adjust the temperature thereof, so as to heat up and/or cool down the flexible resistor 1.

The method of the invention has been designed to obtain a plastic deformation of the flexible flat resistor 1. Advantageously, the method allows to obtain a substantially uniform plastic deformation.

By virtue of the plastic deformation, the flexible resistor 1 is specifically adapted to adhere to a complex item, in particular to the steering wheel of an autovehicle (not shown). To this end, the deformed portion 8 of flexible resistor 1 is, in fact, shaped so as to be curved, so as to have a curvature substantially similar or equal to that of the steering wheel, in particular to the torus of the steering wheel. Preferably, the radius of the torus of the deformed surface is of between 10 and 20 mm, more preferably of between 12.5 and 17.5 mm.

The deformed flexible resistor 1 may optimally coat the torus of the steering wheel, without formation of creases or ripples.

According to an aspect, the invention also provides a steering wheel coated with the resistor deformed by the method of the invention.

According to an embodiment, a flexible resistor is produced with an insulating layer 2 in PVC above which at least one metal track 4 is fixed. The face of the insulating layer 2 provided with the metal track 4 is arranged in contact with the outer surface of the steering wheel. The opposite face of the insulating layer is preferably coated with a steering wheel coating material, for example, natural or synthetic leather, on which a person may place the hands. The at least one metal track is used to heat the steering wheel. The metal track may also be used as a sensor.

According to another embodiment, a sandwich structure is provided, formed by two insulating layers, preferably made of PVC, between which at least one conductive track is arranged, for example, one or two conductive tracks. In this case, it is preferable that each PVC layer has a thickness of between 100 and 300 μm, for example, of about 200 μm. It is further preferable that the conductive track, or the conductive tracks, have a thickness of between 10 and 200 μm, for example of about 60 μm.

An embodiment not shown provides for an insulating layer with a resistive track for the heating, and a track acting as a capacitive or resistive sensor.

Figures 7, 8:
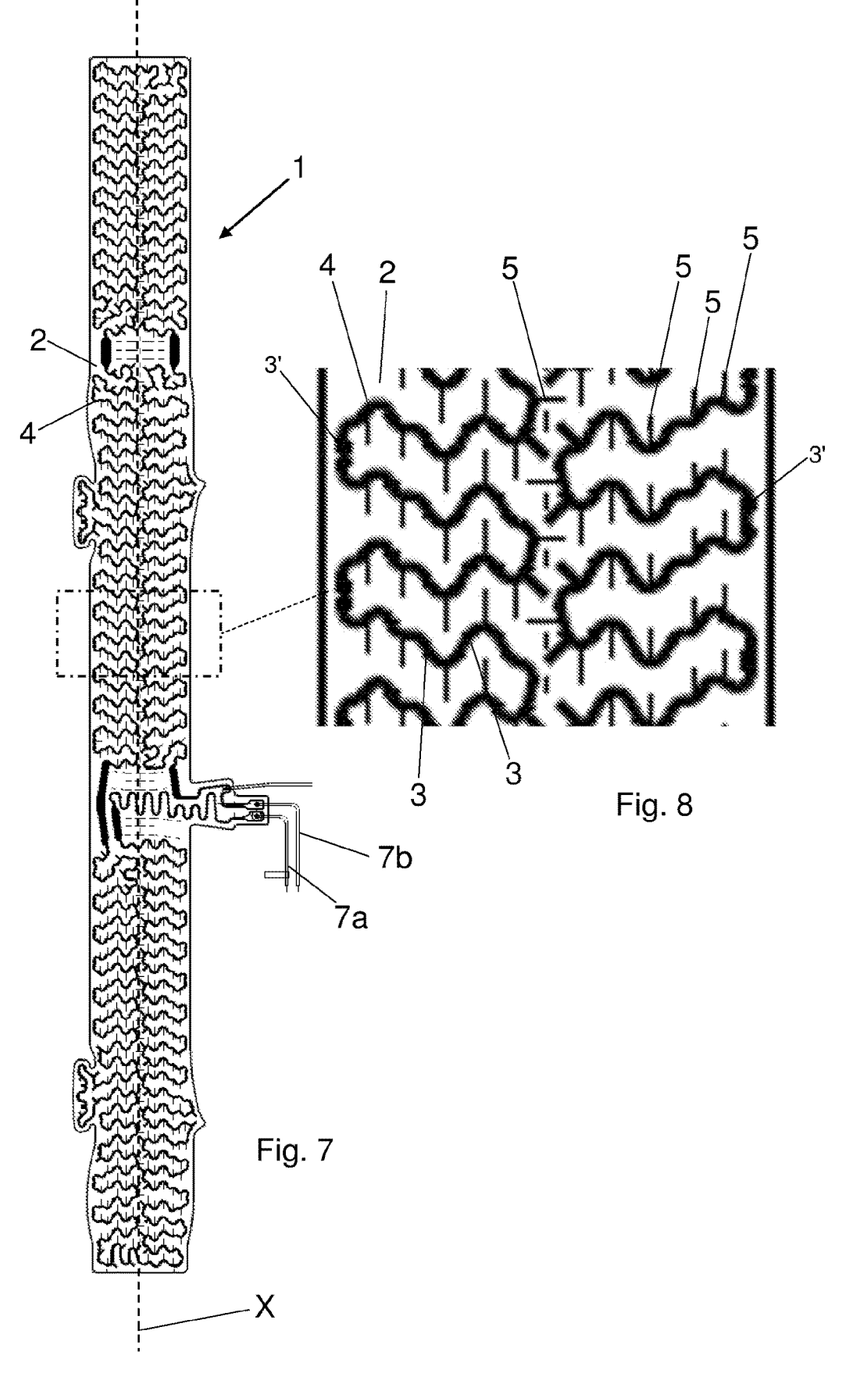
FIG. 7 shows a plan view of an element to be deformed in accordance with the invention.
FIG. 8 shows an enlarged detail of FIG. 7.
Figure 9:
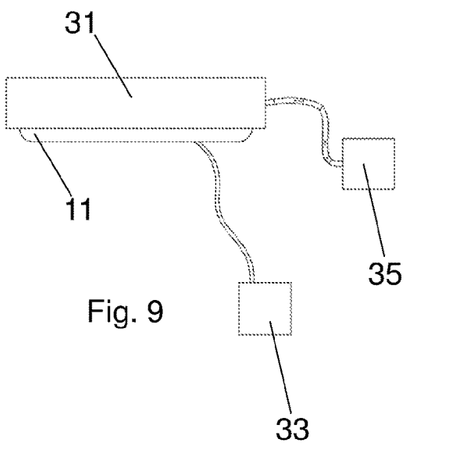
FIG. 9 shows a side view of an example of the device in accordance with the invention.
Figure 10:
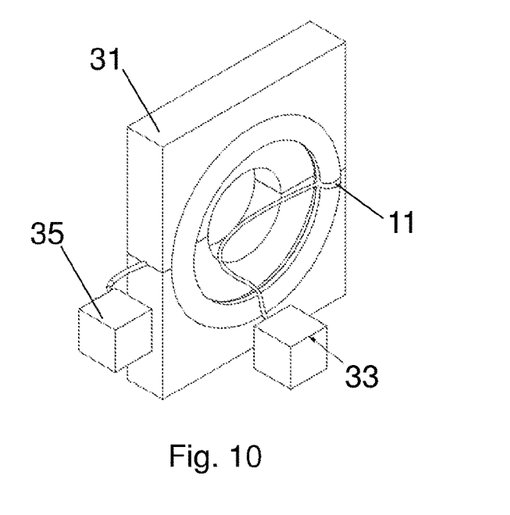
FIG. 10 shows a perspective view of the device of FIG. 9.
Figure 11:
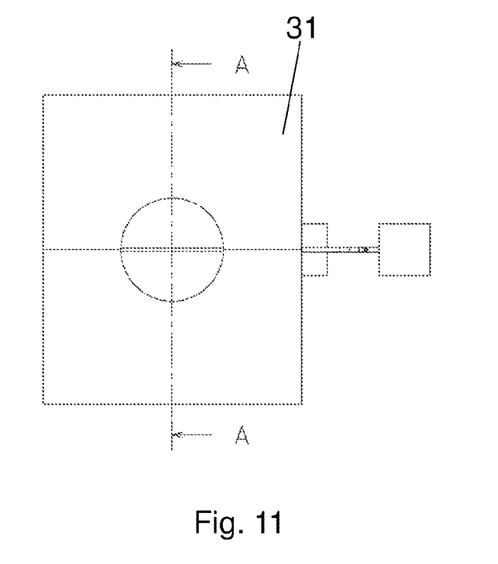
FIG. 11 shows a side view of the device of FIG. 9.
Figure 12:
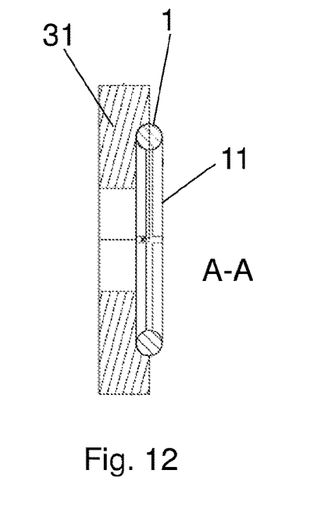
FIG. 12 shows a section of the device of FIG. 11.

The invention also provides a flexible resistor 1 which, not only is improved with respect to the state of the art, but is also particularly adapted to be deformed by the method of the invention. In fact, to this end, it is preferred to select designs, or shapes, of the metal track 4 which allow deformations of the flexible resistor in the three dimensions without interruptions or mechanical breakages, not even partial, occurring on the metal track. To this end, it is preferred that the overall percentage of metal track stretches parallel to the main deformation axis of the flexible resistor 1 is lower than 50% with respect to the total number of metal track stretches. The main deformation axis is preferably the longitudinal axis X of the flexible flat resistor. For example, some stretches parallel to the main deformation axis X are indicated with reference number 3' in FIG. 8.

Additionally, or alternatively to such feature related to the orientation of the stretches 3, it is preferred that resistive track stretches 3 adjacent to one another, having different directions from one another, are joined to one another with radii of curvature greater than 0.5 mm, preferably greater than 1 mm, even more preferably greater than 2 mm.

Typically, the invention provides that the metal track 4, or metal tracks, have a relatively complex shape. For example, each metal track 4 may have a substantially serpentine shape. The serpentine is formed by a plurality of stretches 3, or portions, oriented and joined as described above.

Preferably, each metal track 4 is provided with a plurality of branches 5 or side extensions, typically designed so as not to be crossed by electric current. As current does not flow in such branches 5, the branches do not heat up, since the current tends to pass where it encounters less resistance, i.e., in the resistive track. The function thereof is to act as dissipating fins, which contribute to better uniform and disperse the thermal flow generated by the electric current running through the resistive track 4 on the surface of the flexible resistor. The branches 5 are preferably made of the same material which the resistive track 4 is made of, and, preferably, the branches 5 are integral with the respective resistive track 4. Preferably, each branch 5 is substantially rectilinear.

Preferably, the material of the insulating layer 2 allows a stretching deformation of at least 15%, preferably of at least 30%. It is further preferred that the overall thickness of the flexible flat resistor 1 is of between 0.1 and 1.4 mm, or of between 0.1 and 1.2 mm, or of between 0.1 and 0.8 mm, or of between 0.2 and 0.8 mm, or of between 0.1 and 0.4 mm, or of between 0.2 and 0.4 mm.

A material particularly apt to be the insulating layer is PVC, preferably containing additives and/or plasticizes.

In general, exclusively by way of example, the process described below may be followed to produce flexible flat resistors 1.

One or more sheets of insulating material are passed with a sheet of conductive material between two rollers. The sheets are thus coupled to one another. At least one metal track and possible branches are designed on the conductive sheet, for example by means of photoresist. The parts of the conductive sheet which are not part of the track are then removed, for example by means of chemical etching.

Alternatively, the conductive track is made by means of screen printing, or printing, or by deposition of one or more conductive inks on the insulating layer, whereby the conductive track comprises or is formed by conductive ink.

The invention claimed is:

1. A shaping method to plastically deform a flexible conductive element comprising at least one insulating layer and at least one conductive track fixed to the at least one insulating layer,
   wherein there is provided a device, having an outer surface destined to come in contact with the flexible conductive element, and configured to expand the volume thereof,
   wherein the method comprises the steps of
   a) arranging the flexible conductive element at least partially around said device,
   b) expanding the volume of the device up to a predetermined value, whereby at least one portion of the flexible conductive element which is in contact with the device during the expansion of the device is plastically deformed,
   c) separating the flexible conductive element from the device.

2. The method according to claim 1, wherein said outer surface of the device is curved,
   whereby said at least one portion of the flexible conductive element is deformed so as to have an at least partially curved surface.

3. The method according to claim 2, wherein said outer surface of the device is shaped as the outer surface of a torpid,
   whereby said at least one portion of the flexible conductive element is deformed so as to have an at least partially toroidal surface.

4. The method according to claim 1, wherein before or during or after step c) heat is administered to the flexible conductive element by means of thermoregulation means.

5. The method according to claim 4, wherein the flexible conductive element is heated up to a temperature greater than 25° C.

6. The method according to claim 1, wherein when the volume of the device reaches said predetermined value, the deformed flexible conductive element is kept in contact with the device for a predetermined keeping time.

7. The method according to claim 1, wherein said device comprises a chamber for a fluid, and wherein the expansion of the device is carried out by entering fluid in said chamber of the device.

8. The method according to claim 7, wherein said fluid is entered into the chamber at a temperature greater than 25° C.

9. The method according to claim 1, wherein there are provided deformation control means to prevent the expansion of the volume of the device beyond said predetermined value, whereby during step c), the deformation of the flexible conductive element is controlled.

10. The method according to claim 9, wherein said deformation control means are a body arranged around the flexible conductive element, whereby during, step b), the expansion of the device is prevented when the flexible conductive element gets in contact with said body.

11. A flexible conductive element adapted to be plastically deformed or plastically deformed by the method of claim 1, comprising at least one insulating layer and at least one conductive track fixed to the at least one insulating layer, wherein the conductive track has a plurality of stretches, and wherein the adjacent stretches of said plurality of stretches have a different orientation one another, and wherein said insulating layer is made of a thermoplastic polymeric material.

12. The flexible conductive element according to claim 11, wherein said at least one insulating layer is made of a thermoplastic polymeric material selected from Polyvinyl chloride, Polystyrene, Polypropylene, Polyethylene, Polyethylene terephthalate, and Polyurethane.

13. The flexible conductive element according to claim 11 having an overall thickness of between 0.1 and 1.4 mm, preferably of between 0.1 and 0.8 mm.

14. The flexible conductive element according to any of claim 11, wherein the at least one conductive track has a thickness of between 10 and 200 μm.

15. The flexible conductive element according to claim 11, wherein the at least one conductive track is made of a material selected from Aluminum, Constantan, Copper, German Silver, Steel, Inconel and Brass.

16. The flexible conductive element according to claim 11, wherein said adjacent stretches are joined with a radius of curvature greater than 0.5 mm, preferably greater than 1 mm.

17. The flexible conductive element according to claim 11, wherein the overall percentage of stretches of said at least one conductive track, which are parallel to a longitudinal axis X of the flexible conductive element, is lower than 50% of the total number of stretches of the at least one conductive track.

18. The flexible conductive element according to claim 11, wherein there is provided a plurality of branches of a thermally conductive material extending from the at least one conductive track.

19. The flexible conductive element according to claim 11, wherein the at least one conductive track is formed by a metal foil or wherein the at least one conductive track is formed by a conductive ink.

20. The flexible conductive element according to claim 11, wherein said at least one insulating layer is made of a thermoplastic polymeric non-elastomeric material.

21. The flexible conductive element according to claim 11, wherein said at least one insulating layer has a thickness of between 90 and 500 μm.

22. A steering wheel for a vehicle coated with a flexible conductive element according to claim 11.

* * * * *